US006215338B1

(12) United States Patent
Gervasi et al.

(10) Patent No.: US 6,215,338 B1
(45) Date of Patent: Apr. 10, 2001

(54) MONITORING OF LOW CURRENTS THROUGH A LOW-SIDE DRIVER DMOS BY MODULATING ITS INTERNAL RESISTANCE

(75) Inventors: Luigi Gervasi, San Genesio ed Uniti; Sergio Lecce, Pavia; Franco Cocetta, Premariacco; Mauro Merlo, Torre d'Isola, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/321,141

(22) Filed: May 27, 1999

(30) Foreign Application Priority Data

May 29, 1998 (EP) .................................................. 98830331

(51) Int. Cl.[7] ................................ H03B 1/00; H03K 3/00
(52) U.S. Cl. ............................. 327/108; 327/541; 327/77
(58) Field of Search .................................. 327/77, 80, 89, 327/108, 538, 541

(56) References Cited

U.S. PATENT DOCUMENTS

| 5,079,456 | 1/1992 | Kotowski et al. ................... 307/571 |
| 5,164,659 | 11/1992 | Schultz et al. ........................ 323/351 |
| 5,519,341 | 5/1996 | Corsi et al. ............................ 327/80 |
| 5,614,850 | * 3/1997 | Corsi et al. ............................ 327/55 |
| 5,726,582 | * 3/1998 | Hedberg ................................ 326/30 |
| 5,760,613 | * 6/1998 | Pulvirenti et al. ..................... 327/67 |
| 5,942,921 | * 8/1999 | Talaga, Jr. ............................ 327/77 |

FOREIGN PATENT DOCUMENTS

| 0 419 093 A2 | 9/1990 | (EP) . |
| 0 743 529 A1 | 5/1995 | (EP) . |

OTHER PUBLICATIONS

Electronic Circuit Design (Savant et al., p. 200), 1997.*

* cited by examiner

Primary Examiner—Terry D. Cunningham
Assistant Examiner—Quan Tra
(74) Attorney, Agent, or Firm—Theodore E. Galanthay; Allen, Dyer, Dopelt, Milbrath & Gilchrist, P.A.

(57) ABSTRACT

Relatively low currents are monitored through an integrated DMOS power transistor in a low-side driver configuration. A feedback circuit is responsive to the voltage applied to a gate of the DMOS power transistor to limit the minimum value to which the drain-source voltage may drop to keep it sufficiently high, and to allow a reliable monitoring of the current through the power transistor, even at relatively low levels. This is performed by increasing the conduction resistance of the power transistor at low current levels.

28 Claims, 2 Drawing Sheets

US 6,215,338 B1

MONITORING OF LOW CURRENTS THROUGH A LOW-SIDE DRIVER DMOS BY MODULATING ITS INTERNAL RESISTANCE

FIELD OF THE INVENTION

The present invention relates to the field of semiconductor devices, and, more particularly to a power transistor.

BACKGROUND OF THE INVENTION

Integrated power stages, and in particular low-side and high-side driving stages, are formed by an integrated power transistor that delivers a current to an external load. These integrated power stages are used in numerous applications as a reliable and cost effective alternative to electro-mechanical relays.

While an integrated double-diffused MOS transistor (DMOS) represents an efficient device to switch relatively high powers, its structure must be carefully safeguarded by preventing damaging operating conditions which may cause the device to fail. Therefore, it is common practice to form special circuits that monitor operating conditions to avoid any accidental occurrence of these damaging conditions.

In particular, important information for correctly enabling switching of a low-side driver of the integrated DMOS transistor from a conduction state to an off state, or vice-versa, is one that excludes the existence of an open load condition. To provide this information, actuators in the form of integrated circuits are provided using low-side drivers having sensing circuits capable of timely signaling an eventual open load condition. Commonly, these circuits are required to detect whether an eventual open load state occurs during a phase in which the DMOS power transistor is off. This basic requirement of disabling the switching on of the transistor in case of an open load is currently provided by known circuits.

Although not generally required, sometimes it may be important to recognize an eventual open load condition also during a switched-on condition of the DMOS power transistor. For a low-side driver, it is difficult to satisfy this type of requirement when the current level of discrimination between a conduction state is established at a relatively low value. The conduction state must be defined and recognized as an open load condition. A low value is in the vicinity of 10–50 mA, for example.

The internal resistance Rdson of a conducting DMOS transistor is about 0.5 ohms, and often even lower. Consequently, a direct measurement of the current output by the transistor by monitoring the drain voltage becomes critical. By assuming a discriminating threshold of 30 mA and a resistance Rdson=0.5 oms, a drain-source voltage (i.e., across the transistor's current terminals) of $V_{DS}$=15 mV would be available.

SUMMARY OF THE INVENTION

An object of the present invention is to provide a method and a circuit that monitors relatively low currents through an integrated DMOS power transistor in a low-side driver configuration in a straight forward and reliable manner.

The method according to the present invention uses a feedback circuit that is responsive to the voltage applied to a gate of the DMOS transistor to limit the minimum value to which the drain-source voltage ($V_{DS}$) may drop to keep it sufficiently high. This advantageously allow the current through the transistor to be reliably monitored, even at relatively low levels. This is achieved by modulating or increasing the conduction resistance of the transistor Rdson at low current levels.

DETAILED DESCRIPTION OF THE PREFERRED EMBODIMENTS

Figure 1:
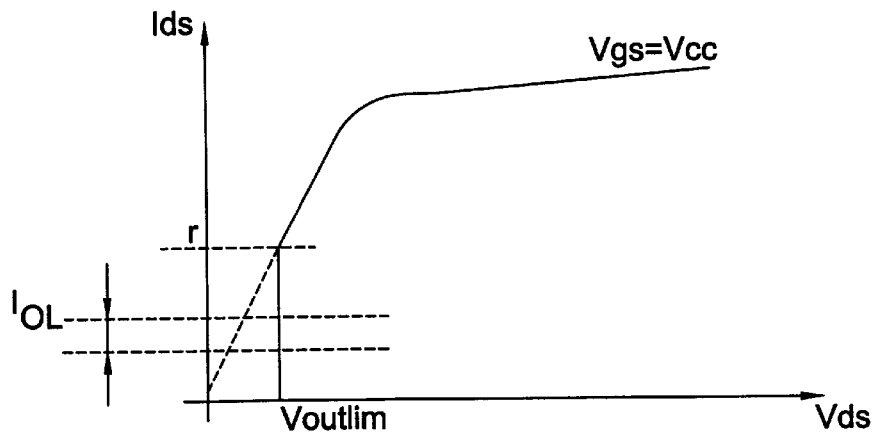
FIG. 1 is a plot of the voltage $V_{DS}$ of an integrated DMOS transistor versus low current levels, according to the present invention.

The diagram of FIG. 1 provides a representation of the need, or at least the opportunity, of limiting to a certain minimum value the drop of the voltage $V_{DS}$ as sensed on the current terminals of an integrated DMOS power transistor. The integrated DMOS power transistor forms a low-side driver to permit monitoring of the current through the transistor even at particularly low levels. This may be reliably done even when the imposed discrimination threshold is a significantly low level.

Figure 2:
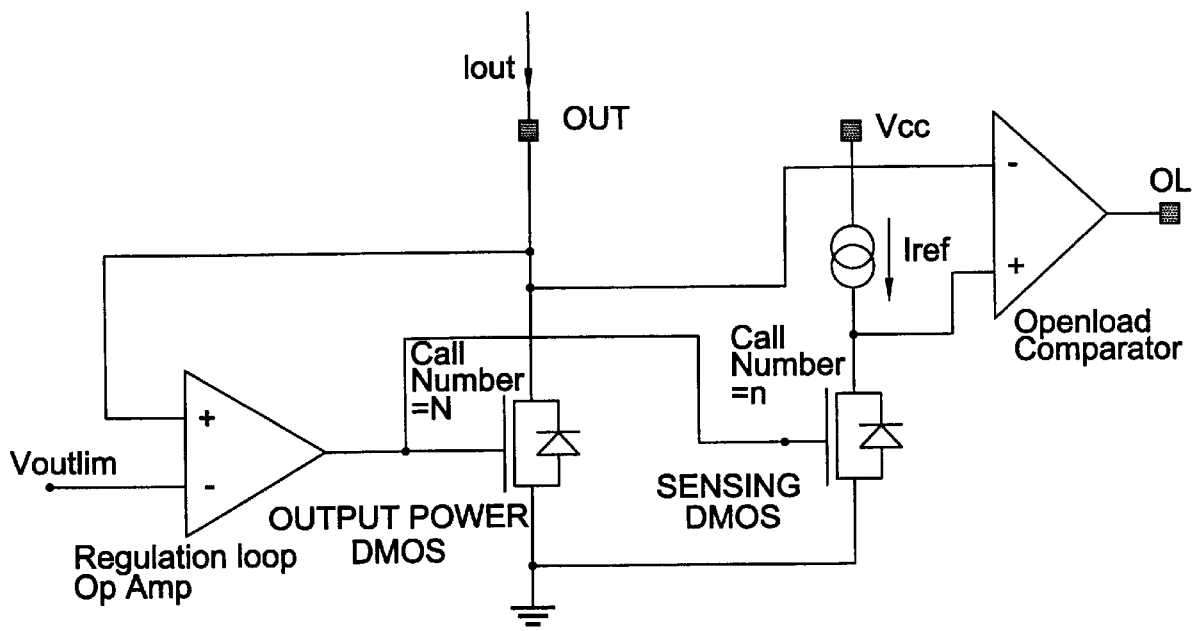
FIG. 2 is a circuit for monitoring an open load condition, according to the present invention.

According to the present invention, a basic scheme of an implemention circuit is shown in FIG. 2. Besides the DMOS output power transistor itself, only the circuit elements that form the sensing circuit of the invention for sensing an eventual open load condition are shown in the figure. The feedback loop is substantially formed by an operational amplifier REGULATION LOOP OP AMP through which a modulation or increase of the conduction resistance Rdson of the transistor limits to a minimum pre-established value Voutlim for the voltage drop on the DMOS transistor $V_{DS}$.

Monitoring the current Iout output by the DMOS transistor is performed by the comparator OPEN LOAD COMPARATOR, which compares the current Iout with a reference current Iref forced by the relative generator though an auxiliary DMOS transistor. The auxiliary DMOS transistor is typically smaller than the power transistor. Both the power transistor and the auxiliary transistor are equally conditioned by the feedback loop. The feedback loop limits the minimum voltage $V_{DS}$ of the power transistor.

The practical aspect of the feedback loop, which is functionally represented in the diagram of FIG. 2 by the operational amplifier, presents particular difficulties for a low-side driver. These difficulties are mainly due to the high gain of the DMOS power amplifier in a common source configuration during weak inversion conditions. For continuous operations, the situation is further complicated because the output of the power transistor may be coupled to an external capacitance which may vary between 0 and 150 nF.

Referring to the basic scheme of FIG. 2, the method of the present invention is qualitatively based on the fact that if the drain voltage $V_{DS}$ tends to drop below the fixed minimum value Voutlim, the operational amplifier lowers the gate voltage of the DMOS power transistor so that its drain voltage will tend to increase. For example, the fixed minimum value Voutlim is due to a drop of the output current Iout.

When the drain voltage remains higher than the fixed minimum value Voutlim, the feedback loop has no effect because the operational amplifier saturates to the supply voltage Vcc, which is also the maximum gate voltage. At this point, sensing by the dedicated comparator OPEN LOOP COMPARATOR of an open load condition may be performed by comparing the drain voltage of the power DMOS transistor OUTPUT POWER DMOS with the drain voltage of the auxiliary DMOS transistor SENSING DMOS. A certain reference current Iref is forced through the auxiliary DMOS transistor SENSING DMOS by a dedicated current generator.

Figure 3:
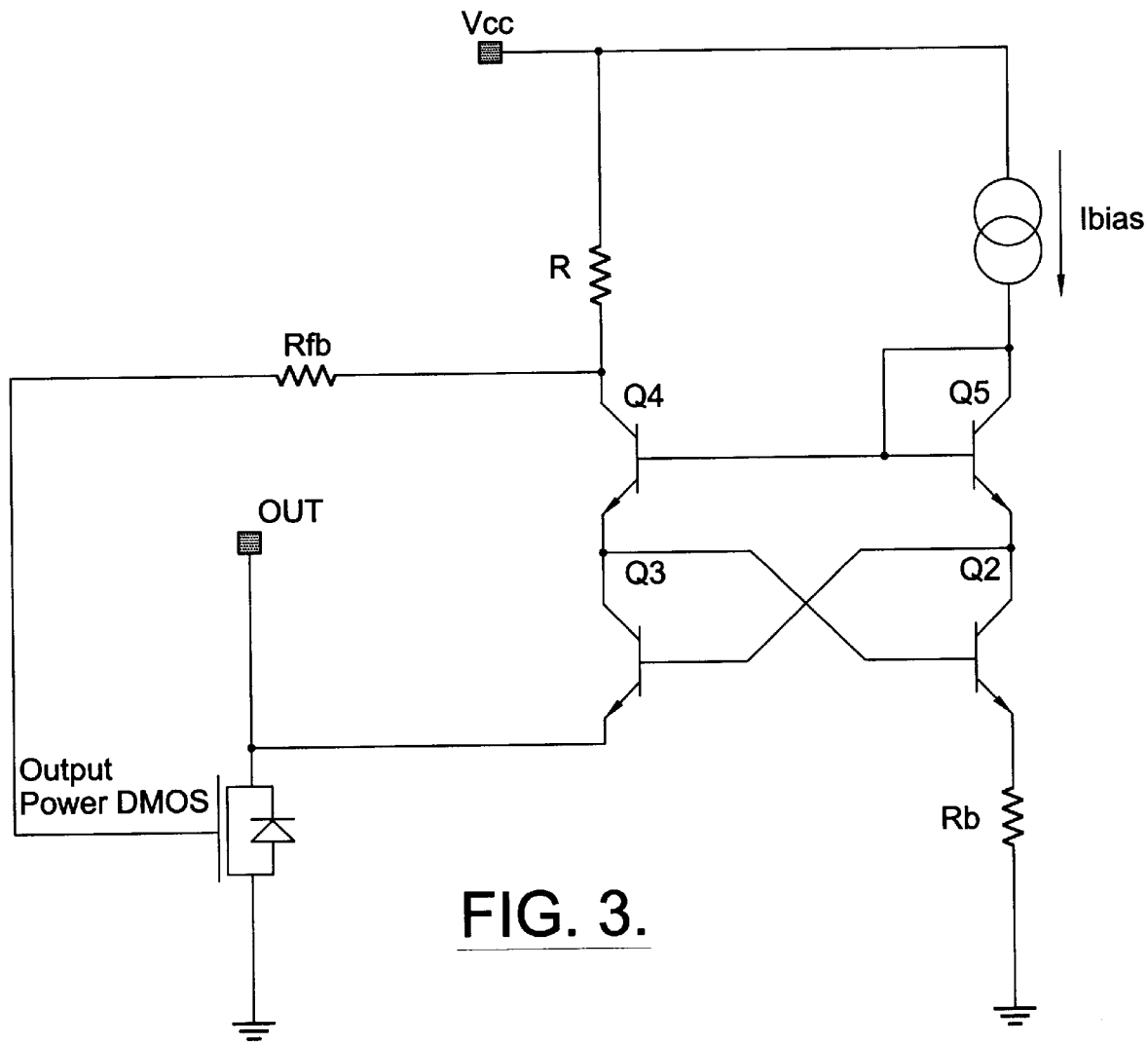
FIG. 3 is a circuit for limiting the minimum value of the voltage $V_{DS}$ at low current levels, according to the present invention.

FIG. 3 shows a particularly effective and reliable circuit providing the feedback loop. Assuming that the pair of transistors Q4 and Q5 form a current mirror having identical areas, the drain regulation voltage Voutlim (which may be set according to requirements) will be given by equation (1):

$$V_{OUTLIM} = V_T \ln\left(\frac{A_3}{A_2}\right) + I_{bias} R_b$$

The variables $A_3$ and $A_2$ are respectively the areas of the transistors $Q_3$ and $Q_2$, and the voltage $V_T$ represents the thermal voltage.

Equation (1) is obtained by ignoring all the base currents of the bipolar transistors that form the circuit of the feedback loop. The value of the output current delivered by the OUTPUT POWER DMOS transistor causes the the regulation loop to begin regulating. In other words, the regulation loop will modulate or increase the internal resistance of the transistor. The increase is given by the following equation (2):

$$I^* = \frac{V_{OUTLIM}}{R_{DSON}(V_{gs} = V_{cc})}$$

With respect to the frequency response, the loop gain of the system has two poles. The loop gain at zero frequency may be expressed by equation (3) as:

$$|A_0 = G_m R$$

The variable $G_m$ is the transconductance of the power DMOS transistor.

The dominant pole is determined by the gate-source capacitance of the DMOS power transistor, and is given by equation (4):

$$P_d = \frac{1}{(R + R_{fb}) C_{gs-DMOS}}$$

The stabilizing effect of Rfb is thus evident, which is the reason why this feedback resistor is provided.

Position of the second pole associated with the capacitance coupled to the drain of the DMOS depends also on the capacitance of the externally connected load. The low impedance level of the drain node ensures the stability of the system even in the presence of a broad spread of external capacitance values. The circuit includes an inner positive feedback loop due to the cross coupling of the transistors Q2 and Q3, which must be properly compensated. The function of the resistance Rb is to compensate such an internal loop formed by transistors Q2 and Q3, and by emitter degeneration of transistor Q2, thus reducing the gain of such an internal positive feedback loop.

That which is claimed is:

1. A low-side driver circuit comprising:
    a first DMOS transistor comprising a source and a drain;
    a feedback circuit controlling a gate voltage of said first DMOS transistor by limiting to a fixed level a drain-source voltage by increasing an internal resistance of said first DMOS transistor when the drain-source voltage drops below the fixed level; and
    a comparator having a first input connected to the drain of said first DMOS transistor for comparing a signal output by said first DMOS transistor with a reference signal for producing an output signal representative of an open load condition during a switched on state of said first DMOS transistor.

2. A load-side driver circuit according to claim 1, further comprising:
    an auxiliary DMOS transistor connected in parallel to said first DMOS transistor, a size of said auxiliary DMOS transistor being less than a size of said first DMOS transistor; and
    a current generator connected between a power supply and a drain of said auxiliary DMOS transistor providing the reference signal through said auxiliary DMOS transistor.

3. A load-side driver circuit according to claim 2, wherein said feedback circuit comprises an operational amplifier having a non-inverting input coupled to the drain of said first DMOS transistor, an inverting input coupled to a pre-established limiting voltage, and an output coupled to respective gates of said first and auxiliary DMOS transistors.

4. A load-side driver according to claim 3, wherein said operational amplifier comprises:
    a first resistor;
    a second and a third transistor cross-connected to each other, an emitter of said third transistor connected to the drain of said first DMOS transistor and an emitter of said second transistor connected through said first resistor to a voltage reference;
    a bias current generator connected to the power supply;
    a second resistor connected to the power supply;
    a third resistor connected to respective gates of said first DMOS transistor and said auxiliary DMOS transistor;
    a fourth and a fifth transistor connected together to define a current mirror, a collector of said fourth transistor connected to said bias current generator, a collector of said fifth transistor connected to said second resistor and to said third transistor; and
    a difference between respective base-emitter voltages of said second and third transistors providing the pre-established limiting voltage of the drain-source voltage of said first DMOS transistor.

5. A load-side driver circuit according to claim 4, wherein said second, third, fourth and fifth transistors each comprise an NPN bipolar junction transistor.

6. A load-side driver circuit according to claim 2, wherein said comparator includes a second input coupled to a drain of said auxiliary DMOS transistor.

7. An integrated circuit comprising:
    a first DMOS transistor defining a low-side driver to be connected between an external load and a voltage reference;
    an auxiliary DMOS transistor connected in parallel to said first DMOS transistor, a size of said auxiliary DMOS transistor being less than a size of said first DMOS transistor;
    a current generator connected between a power supply and a drain of said auxiliary DMOS transistor providing a reference current through said auxiliary DMOS transistor;
    a feedback loop comprising an operational amplifier having a non-inverting input coupled to a drain of said first DMOS transistor, an inverting input coupled to a pre-established limiting voltage, and an output coupled to respective gates of said first and auxiliary DMOS transistors; and a comparator having respective inputs coupled to drains of said first and auxiliary DMOS transistors, an output signal of said comparator indicating an open load condition of the low-side driver during a switched on state of said first DMOS transistor.

8. An integrated circuit according to claim 7, wherein said operational amplifier comprises:

a first resistor;

a second and a third transistor cross-connected to each other, an emitter of said third transistor connected to the drain of said first DMOS transistor and an emitter of said second transistor connected through said first resistor to the voltage reference;

a bias current generator connected to the power supply;

a second resistor connected to the power supply;

a third resistor connected to respective gates of said first DMOS transistor and said auxiliary DMOS transistor;

a fourth and a fifth transistor connected together to define a current mirror, a collector of said fourth transistor connected to said bias current generator, a collector of said fifth transistor connected to said second resistor and to said third transistor; and a difference between respective base-emitter voltages of said second and third transistors providing the pre-established limiting voltage of a drain-source voltage of said first DMOS transistor.

9. An integrated circuit according to claim 8, wherein said second, third, fourth and fifth transistors each comprise an NPN bipolar junction transistor.

10. An integrated circuit according to claim 7, wherein the voltage reference is ground.

11. A low-side driver circuit comprising:

a first DMOS transistor defining a low-side driver to be connected between an external load and a voltage reference; and a sensing circuit sensing an open load condition of the low-side driver during a switched on state of said first DMOS transistor, said sensing circuit comprising an auxiliary DMOS transistor connected in parallel to said first DMOS transistor, a current generator connected between a power supply and a drain of said auxiliary DMOS transistor providing a reference current through said auxiliary DMOS transistor, a feedback loop comprising an operational amplifier having a non-inverting input coupled to a drain of said first DMOS transistor, an inverting input connected to a pre-established limiting voltage, and an output coupled to respective gates of said first and auxiliary DMOS transistors, and a comparator having respective inputs coupled to drains of said first and auxiliary DMOS transistors, an output signal of said comparator indicating the open load condition.

12. An integrated circuit according to claim 11, wherein a size of said auxiliary DMOS transistor is less than a size of said first DMOS transistor.

13. An integrated circuit according to claim 11, wherein said operational amplifier comprises:

a first resistor;

a second and a third transistor cross-connected to each other, an emitter of said third transistor connected to the drain of said first DMOS transistor and an emitter of said second transistor connected through said first resistor to the voltage reference;

a bias current generator connected to a power supply;

a second resistor connected to the power supply;

a third resistor connected to respective gates of said first DMOS transistor and said auxiliary DMOS transistor;

a fourth and a fifth transistor defining a current mirror, a collector of said fourth transistor connected to said bias current generator, a collector of said fifth transistor connected to said second resistor and to said third transistor; and a difference between respective base-emitter voltages of said second and third transistors providing the pre-established limiting voltage of the drain-source voltage of said first DMOS transistor.

14. An integrated circuit according to claim 13, wherein said second, third, fourth and fifth transistors each comprises an NPN bipolar junction transistor.

15. An integrated circuit according to claim 11, wherein the voltage reference is ground.

16. A method of monitoring output current of a low-side driver comprising an integrated DMOS transistor, the method comprising:

controlling a gate voltage of the DMOS transistor through a feedback circuit that limits to a lower fixed level a drain-source voltage of the DMOS transistor by increasing its internal resistance when the drain-source voltage drops below the lower fixed level, the DMOS transistor comprising a source and a drain for connection to a load; and comparing a current output by the DMOS transistor with a reference fixed current for producing a signal representative of an open load condition.

17. A method according to claim 16, wherein controlling the gate voltage comprises lowering the drain-source voltage of the DMOS transistor when the drain-source voltage drops below the lower fixed level.

18. A method according to claim 16, wherein controlling the gate voltage comprises saturating the DMOS transistor to a power supply voltage when the drain-source voltage exceeds the lower fixed level.

19. A method according to claim 16, further comprising conducting the reference fixed current through an auxiliary DMOS transistor.

20. A method according to claim 16, wherein comparing is performed using a comparator to produce a digital signal.

21. A method according to claim 16, wherein the feedback circuit comprises a pair of transistors operating as a current mirror.

22. A method of monitoring output current of a low-side driver comprising a DMOS transistor, the method comprising:

controlling a gate voltage of the DMOS transistor through a feedback circuit that limits to a lower fixed level a drain-source voltage of the DMOS transistor, the DMOS transistor comprising a source and a drain for connection to a load; and comparing a current output by the DMOS transistor with a reference fixed current for producing a signal representative of an open load condition.

23. A method according to claim 22, wherein controlling the gate voltage comprises increasing an internal resistance of the DMOS transistor when the drain-source voltage drops below the lower fixed level.

24. A method according to claim 22, wherein controlling the gate voltage comprises lowering the drain-source voltage of the DMOS transistor when the drain-source voltage drops below the lower fixed level.

25. A method according to claim 22, wherein controlling the gate voltage comprises saturating the DMOS transistor to a power supply voltage when the drain-source voltage exceeds the lower fixed level.

26. A method according to claim 22, further comprising conducting the reference fixed current through an auxiliary DMOS transistor.

27. A method according to claim 22, wherein comparing is performed using a comparator to produce a digital signal.

28. A method according to claim 22, wherein the feedback circuit comprises a pair of transistors operating as a current mirror.

* * * * *

UNITED STATES PATENT AND TRADEMARK OFFICE
CERTIFICATE OF CORRECTION

PATENT NO. : 6,215,338 B1　　　　　　　　　　　　　　　　　　　　　Page 1 of 2
DATED : April 10, 2001
INVENTOR(S) : Luigi Gervasi, Sergio Lecce, Franco Cocetta and Mauro Merlo It is certified that error appears in the above-identified patent and that said Letters Patent is hereby corrected as shown below:

<u>Drawings,</u>
FIG.1, delete "FIG. 1 " insert -- new FIG. 1 --

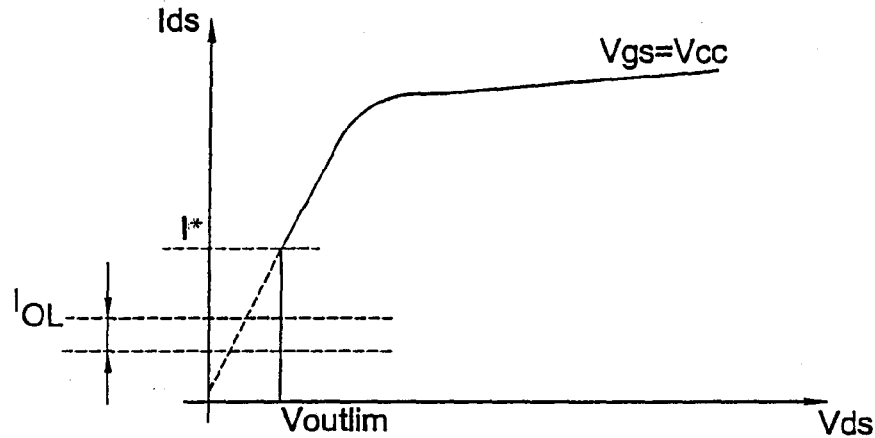

FIG. 1.

FIG.2, delete "FIG. 2 " insert -- new FIG. 2 --

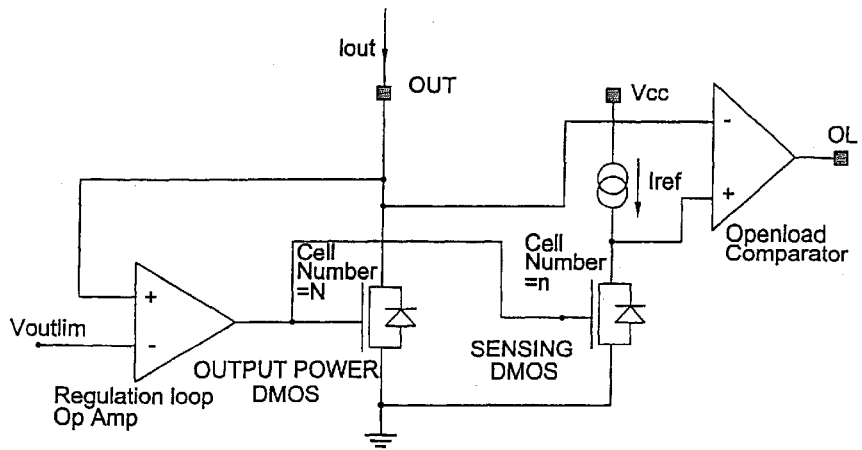

FIG. 2.

UNITED STATES PATENT AND TRADEMARK OFFICE
CERTIFICATE OF CORRECTION

PATENT NO.   : 6,215,338 B1
DATED        : April 10, 2001
INVENTOR(S)  : Luigi Gervasi, Sergio Lecce, Franco Cocetta and Mauro Merlo It is certified that error appears in the above-identified patent and that said Letters Patent is hereby corrected as shown below:

<u>Column 1,</u>
Line 52, delete "0.5 oms," insert -- 0.5 ohms, --
Line 65, delete "allow" insert -- allows --

<u>Column 3,</u>
Line 36, delete " $|A_0 = G_mR$" insert -- $|A_0| = G_mR$ --

<u>Column 6,</u>
Lines 20 and 21, delete "transistors each comp rises an" insert -- transistors each comp-rises an --

Signed and Sealed this

Eighteenth Day of June, 2002

*Attest:*

JAMES E. ROGAN
*Attesting Officer*   *Director of the United States Patent and Trademark Office*